United States Patent
Smith

(10) Patent No.: US 8,941,143 B2
(45) Date of Patent: Jan. 27, 2015

(54) LIGHTING ELEMENTS

(75) Inventor: Euan Smith, Cambridgeshire (GB)

(73) Assignee: Cambridge Display Technology Limited, Cambridgeshire (GB)

(*) Notice: Subject to any disclaimer, the term of this patent is extended or adjusted under 35 U.S.C. 154(b) by 0 days.

(21) Appl. No.: 13/805,741

(22) PCT Filed: Jul. 4, 2011

(86) PCT No.: PCT/GB2011/001006
§ 371 (c)(1),
(2), (4) Date: Mar. 13, 2013

(87) PCT Pub. No.: WO2012/004552
PCT Pub. Date: Jan. 12, 2012

(65) Prior Publication Data
US 2013/0193425 A1    Aug. 1, 2013

(30) Foreign Application Priority Data

Jul. 5, 2010    (GB) .................................. 1011262.1

(51) Int. Cl.
*H01L 33/62*    (2010.01)
*H01L 51/52*    (2006.01)
*H01L 33/38*    (2010.01)

(52) U.S. Cl.
CPC ........ *H01L 51/5203* (2013.01); *H01L 51/5212* (2013.01); *H01L 51/5228* (2013.01); *H01L 33/38* (2013.01); *H01L 2251/5361* (2013.01)
USPC ......................... 257/99; 257/40; 257/E33.066

(58) Field of Classification Search
CPC . H01L 33/38; H01L 51/5203; H01L 51/5228; H01L 51/5212
USPC ...................................... 257/40, 99, E33.066
See application file for complete search history.

(56) References Cited

U.S. PATENT DOCUMENTS

| | | | |
|---|---|---|---|
| 4,539,507 | A | 9/1985 | VanSlyke et al. |
| 2004/0263085 | A1 | 12/2004 | Chen et al. |

(Continued)

FOREIGN PATENT DOCUMENTS

| | | | |
|---|---|---|---|
| EP | 1 484 632 | A1 | 12/2004 |
| GB | 2 343 994 | A | 5/2000 |

(Continued)

OTHER PUBLICATIONS

International Search Report and Written Opinion for Application No. PCT/GB2011/001006, dated Nov. 23, 2011.

(Continued)

*Primary Examiner* — Michael Trinh
*Assistant Examiner* — Toniae Thomas
(74) *Attorney, Agent, or Firm* — Marshall, Gerstein & Borun LLP

(57) ABSTRACT

An OLED lighting element comprises a substrate bearing an OLED structure extending laterally over said substrate and sandwiched between first and second electrode layers. The first electrode layer defines a plurality of electrically conductive tracks and said second electrode layer comprises a substantially continuous electrically conducting layer. The OLED lighting element has an electrical bus-bar connected to said electrically conductive tracks extending substantially completely along the or each lateral edge of said lighting element. The electrically conductive tracks run in a radial direction from a laterally central location within said lighting element towards said bus-bar along said lateral edges of said lighting element. A said track subdivides into a plurality of tracks with increasing distance from said central location. This arrangement makes more efficient use of the conductive tracks.

14 Claims, 5 Drawing Sheets

(56) References Cited

U.S. PATENT DOCUMENTS

| | | |
|---|---|---|
| 2005/0133806 A1 | 6/2005 | Peng et al. |
| 2005/0161779 A1 | 7/2005 | Peng et al. |
| 2005/0230700 A1 | 10/2005 | Stefanov et al. |
| 2006/0108918 A1 | 5/2006 | Cok et al. |
| 2006/0124954 A1 | 6/2006 | Akaishi |
| 2008/0197376 A1* | 8/2008 | Bert et al. ............... 257/99 |
| 2009/0212307 A1 | 8/2009 | Baur et al. |
| 2010/0090207 A1 | 4/2010 | Klein et al. |

FOREIGN PATENT DOCUMENTS

| | | |
|---|---|---|
| JP | 6-296041 A | 10/1994 |
| JP | 10-256602 A | 9/1998 |
| JP | 2003-243708 A | 8/2003 |
| WO | WO-90/13148 A1 | 11/1990 |
| WO | WO-95/06400 A1 | 3/1995 |
| WO | WO-99/48160 A1 | 9/1999 |
| WO | WO-2008/135902 A2 | 11/2008 |
| WO | WO-2009/127175 A1 | 10/2009 |

OTHER PUBLICATIONS

International Preliminary Report on Patentability for Application No. PCT/GB2011/001006, dated Jan. 8, 2013.

Search Report for Application No. GB1011262.1, dated Nov. 23, 2010.

Search Report for Application No. GB1011262.1, dated Mar. 8, 2011.

* cited by examiner

LIGHTING ELEMENTS

FIELD OF THE INVENTION

This invention relates to LED (light emitting diode) lighting elements, in particular OLED (organic light emitting diode) lighting tiles, and to methods of designing and fabricating such lighting tiles.

BACKGROUND TO THE INVENTION

Organic light emitting diodes (OLEDs) are particularly useful for lighting because they can relatively easily and cheaply be fabricated to cover a large area on a variety of substrates. They are also bright and may be colored or white (red, green and blue) as desired. In this specification references to organic LEDs include organometallic LEDs, and OLEDs fabricated using either polymers or small molecules. Examples of polymer-based OLEDs are described in WO 90/13148, WO 95/06400 and WO 99/48160; examples of so called small molecule based devices are described in U.S. Pat. No. 4,539,507.

To aid in understanding embodiments of the invention it is helpful to describe an example structure of an OLED lighting tile. Thus referring to FIG. 1a, this shows a vertical cross-section through a portion of an OLED lighting tile 10 comprising a glass substrate 12 on which metal, for example copper tracks 14 are deposited to provide a first electrode connection, in the illustrated example an anode connection. A hole injection layer 16 is deposited over the anode electrode tracking, for example a conductive transparent polymer such as PEDOT: PSS (polystyrene-sulphonate-doped polyethylene-dioxythiophene). This is followed by a light emitting polymer (LEP) stack 18, for example comprising a PPV (poly (p-phenylenevinylene)-based material: The hole injection layer helps to match the hole energy levels of this layer to the anode metal. This is followed by a cathode layer 20, for example comprising a low work function metal such as calcium or barium with an optional electron injection layer (not shown) such as lithium fluoride for energy matching, over which is deposited a reflective back (cathode) electrode 22, for example of aluminum or silver.

The example of FIG. 1a is a "bottom emitter" device in which light is emitted through the transparent glass or plastic substrate. However a "top emitter" device may also be fabricated in which an upper electrode of the device is substantially transparent, for example fabricated from indium tin oxide (ITO) or a thin layer of cathode metal (say less than 100 µm thickness). Referring now to FIG. 1b this shows a view of the light emitting tile 10 of FIG. 1a looking towards the LEP stack through the substrate 12, that is looking into the light-emitting face of the device through the "bottom" of the device. This view shows that the anode electrode tracks 14 are, in this example, configured as a hexagonal grid or mesh, in order to avoid obscuring too much light from the LEP stack. The (anode) electrode tracks are connected to a solid copper busbar 30 which runs substantially all the way around the perimeter of the device, optionally with one or more openings, which may be bridged by an electrical conductor) to facilitate that connection to the cathode layer of the device.

It is generally desirable to reduce the amount of light obscured by the tracking, more precisely to improve the ratio of the voltage drop across a tile to the epiture ratio which is lost to the tracking. The inventor determined the resistance of the example mesh of FIG. 1b in different directions in the plane of the device and established that the sheet resistance is substantially the same in any direction, and for various different types of mesh, triangular, hexagonal, square and so forth.

Known OLED electrode structures are described in WO2009/127175 and US2004/0263085.

SUMMARY OF THE INVENTION

According to a first aspect of the invention there is provided an LED lighting element.

The LED lighting element may comprise a substrate bearing an LED structure extending laterally over said substrate and sandwiched between first and second electrode layers, wherein said first electrode layer defines a plurality of electrically conductive tracks and said second electrode layer comprises a substantially continuous electrically conducting layer, said LED lighting element having an electrical busbar connected to said electrically conductive tracks, said busbar extending substantially completely along the or each lateral edge of said lighting element, and wherein said tracks run generally radially from a laterally central location within said lighting element towards said busbar along said lateral edges of said lighting element.

Broadly speaking the inventor has recognized that the current flowing in a lateral plane of the device, in particular the plane in which the electrode tracks are located defines a vector field and that, broadly speaking, conductive tracks which join equipotentials which carry no current and are of little value. In the example of a hexagonal mesh discussed above the effect of this is that around half the copper is effectively unused (at least for thin tracks), and that more efficient use can be made of the copper by running the tracks along the directions in which current flows. In the case of a tile in which a busbar runs around the lateral edges or perimeter of the tile (the tile may be circular or elliptical) the current flow is approximately radially inwards or outwards from a central location within the lighting element (tile) to the busbar. One can imagine an arrangement in which two square or rectangular tiles are conceptually abutted against one another laterally, in which case there could be two effective centres for a tile of this type.

In embodiments of this approach it is preferable that the lateral sheet resistance of the tracking layer should be approximately or substantially independent of distance along a radius from the centre. One way to achieve this would be to vary the lateral cross-section or width of a track along a radial direction, to increase the conductance with distance from the centre. However a better approach is to subdivide a track with increasing distance from the central location so that with increasing radial distance the track fans out in a tree structure. Thus in embodiments a number density of tracks per unit of circumferential length around an (imaginary) circle or ellipse centred at the central location from which the tracks diverge, is substantially the same for a plurality of different radii of this (imaginary) circle or ellipse. Thus the lighting element or tile may be notionally sub-divided into a set of bands or rings around the center at regular radial increments, and the number of tracks arranged so that there is a ring within each band on which there is the same number of tracks per unit circumferential length. For example the tracks may be arranged so that if the radius doubles the number of tracks (per unit circumferential length) doubles. The skilled person will, however, recognize that other relationships are possible albeit with some potential distortion of the radial pattern.

This approach provides some significant advantages, but there is a further optimization which may also be employed. Thus the inventor has recognized that because current flows from a track through the LEP stack to an opposing electrode the current flowing at different points along the length of a generally radial track varies. There is therefore scope for increasing the resistance of a track when the current flowing through the track is reduced. Thus, in embodiments, the average sheet resistance may be inversely proportional to the current flowing, more particularly to the current density (which may be defined as the current per unit length perpendicular to the direction of current flow). Thus in embodiments the current density through the OLED structure is a substantially constant number of amps per meter squared and the sheet current density is a substantially constant number of amps per meter.

In embodiments, therefore, an average sheet conductance of the first (tracking) electrode layer (averaged over an area sufficiently large to encompass a plurality of tracks), measured in a radial direction varies according to the current density, which is effectively the current density in the second substantially continuous electrode layer. One way this may be achieved is by varying the width and/or thickness of a track, but in some preferred embodiments this is achieved by varying the track spacing. Thus in embodiments the numbered entity of the tracks around a circumference of the (imaginary) circle in the first, tracking electrode layer varies dependent on the current density at a location (ring or band) defined by a radius of the circle, in the second, continuous electrode layer. In embodiments, therefore, the tracks are curved. More particularly in embodiments a number density of the tracks per unit area is lower adjacent to the central location than adjacent a lateral edge of the lighting element. Thus the effect of taking account of the heat current density is to distort the pattern of tracks to effectively spread the central portion of the pattern out over a larger area, in effect taking the previously described pattern and stretching a central region of the pattern substantially uniformerly in a radial direction.

In embodiments at the central location at least some of the radial tracks are electrically connected to one another to reduce the distance of a point in the central region of the OLED structure to a nearby track.

It will be appreciated that an LED lighting element or lighting tile as described above need not be square or rectangular but may have other-fold symmetry. Although the techniques described are particularly applicable to organic LEDs because of their ease of large area fabrication, in principle they may also be applied to inorganic LED lighting tiles. Similarly, although references have been made to planar structures, it will be appreciated that the above described techniques are not limited to flat planar structures and may be employed with curved laterally extending structures and with an OLED lighting element fabricated on a flexible substrate such as plastic. Thus "planar" is to be interpreted broadly. The skilled person will further appreciate that the above described techniques may be employed with either top emitting or bottom emitting devices.

The above described techniques for adapting the sheet resistance of a tracking electrode layer to the current flow within the layer may also be applied to other types of LED lighting element.

Thus in a related aspect there is provided an LED lighting element comprising a substrate bearing an LED structure extending laterally over said substrate and sandwiched between first and second electrode layers, wherein said first electrode layer defines a plurality of electrically conductive tracks and said second electrode layer comprises a substantially continuous electrically conducting layer, said LED lighting element having a first electrical busbar connected to said electrically conductive tracks, said first busbar extending along a first lateral edge of said lighting element, said lighting element having a second electrical busbar connected to said second electrode layer and extending along a second lateral edge of said lighting element, wherein a direction of current flow from said first electrical busbar towards said second electrical busbar defines a longitudinal direction, wherein said tracks extend away from said first busbar, and wherein an average sheet conductance of said first electrode layer across a width of said lighting element perpendicular to said longitudinal direction varies in said longitudinal direction to decrease with increasing distance from said first busbar.

Embodiments of the above described approach allow the sheet resistance or conductance of the tracks across a width of the lighting element (for example a width substantially equal to the length of the first busbar) to vary with the direction of current flow down the lighting element, and hence improve metal (copper) use. In one approach the average (in the direction of current flow) increases linearly with distance from the first busbar, although a better approach is for the sheet conductance to decrease linearly; because conductance is the reciprocal of resistance linear change in one is a non-linear change in the other.

One way to achieve this would be to change the thickness and/or width of the tracks as they extend away from the first busbar, but an easier approach is to arrange the tracks so that a number of tracks across a width of the lighting element decreases with increasing distance from the first busbar. Thus in embodiments the number of tracks per unit at length perpendicular to the direction of current flow decreases with increasing distance from the first busbar. The decrease may be linear to provide a linear increase in sheet resistance or the decrease may be so as to provide a linear increase in sheet conductance, which results in curved tracks.

In embodiments, therefore the tracks define at least one fan pattern such that within the fan a spacing between the tracks increases with increasing distance from the first busbar. It is useful to provide across-tracks linking branches of the fan (in case of track breaks and the like), and one convenient way of achieving this is to arrange the tracks so that they define a pair of overlapping fans.

Again the skilled person will recognize that a large LED lighting element may comprise a plurality of smaller elements each as described above. Again top or bottom emitters may be employed (or even a non-organic LED structure) and the lighting element need not be flat—the substrate may be curved or flexible.

In a further aspect there is provided an LED lighting element wherein said lighting element is an OLED lighting tile.

In a still further aspect there is provided an OLED lighting tile, the tile comprising: a substrate; an OLED structure extending laterally on said substrate; first and second electrode layers vertically disposed to either side of said OLED structure to make electrical connections to said OLED structure; first and second electrical connections respectively to said first and second electrode layers to provide power for illuminating said OLED light tile, wherein at least one of said electrical connections comprises an edge electrical connection extending along at least two adjacent edges of said OLED lighting tile; wherein said first electrode layer connected to said edge electrical connection defines a plurality of conductive tracks; and wherein said conductive tracks are arranged to lie generally along a direction of lateral current flow in said second electrode layer.

Where the second electrode layer is substantially continuous the conductive tracks may be configured such that the average sheet conductance of the first electrode layer is dependent on the average current density in the second electrode layer.

In a related aspect the invention also provides a method fabricating an OLED lighting tile, the method comprising: providing a substrate bearing an OLED structure extending laterally over said substrate and sandwiched between first and second electrode layers to make electrical connections to said OLED structure, wherein said first electrode layer defines a plurality of electrically conductive tracks and said second electrode comprises a substantially continuous electrically conducting layer; and wherein the method further comprises one or both of: orientating said tracks along directions current flows in said first electrode layer; and configuring a physical cross-section or number density of said tracks such that an average sheet conductance of said first electrode layer in a direction perpendicular to a direction current flows in said second electrode layer varies with current density of said current which flows in said second electrode layer such that said average sheet conductance is higher where said current density is relatively higher and lower where said current density is relatively lower.

The invention also provides an OLED lighting tile fabricated according to the above described method. In embodiments the average sheet conductance comprises a sheet conductance per unit area over an area including a plurality of the tracks.

BRIEF DESCRIPTION OF THE DRAWINGS

These and other aspects of the invention will now be further described, by way of example only, with reference to the accompanying Figures in which.

DETAILED DESCRIPTION OF PREFERRED EMBODIMENTS

One method to boost the conductivity of the anode connection of a large area OLED lighting tile is to use a matrix of tracks. Hexagonal or square tiled matrices may be employed. However in any given area of the tile the current flowing through the anode will have a single dominant direction. For example in a tile where there is current supplied from all sides the current will flow towards the centre from the edges. For a tile connected along one or two opposite edges the current will flow in a straight line across the tile. Conduction will be supplied by tracks which are well aligned with this current direction, conversely the tracks which are aligned perpendicular to the direction of current flow provide very little contribution and are therefore wasted. On average for a regular tile the sheet conduction obtained is only half that possible with a given amount of conductor, in other words half of the tracking is not needed.

There is a further problem, that of current density. Regardless of the direction of current flow, as you track from next to a connection point of a tile in the direction of current flow the current density will drop (roughly linearly) as current flows through the OLED device itself. Thus the most amount of tracking is required next to the points of connection, and the least at the furthest points away.

Figure 2A:
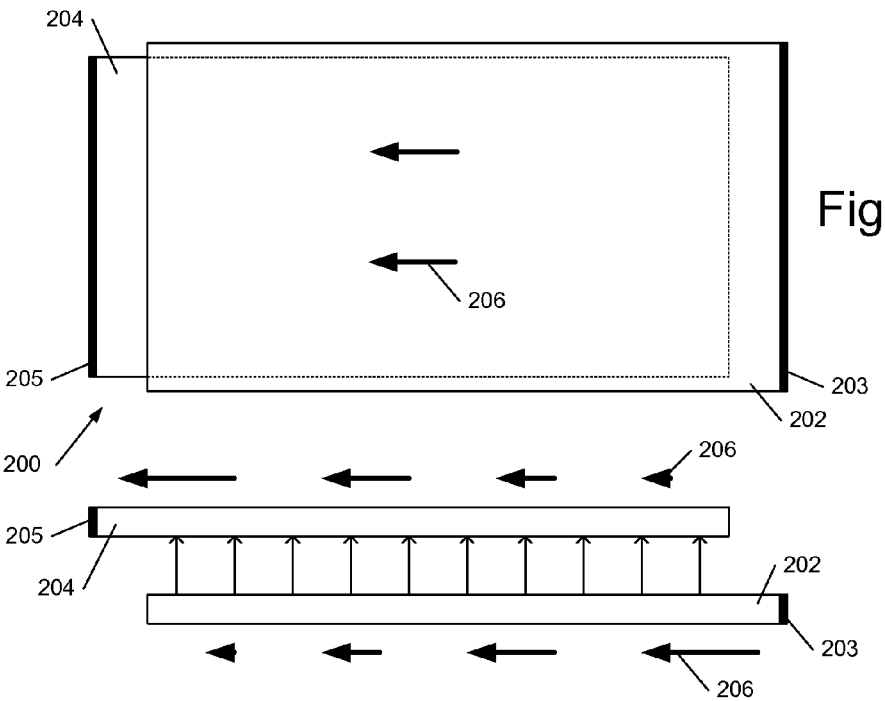
FIGS. 2a-2c show, respectively, an OLED lighting tile connected at either end and the cross-sectional view of the tile illustrating current flow within the tile and its electrodes, and a view of an LED lighting tile with each electrode connected at both ends of the tile so that the electro-connections are on pairs of opposite sides.
Figure 2B:
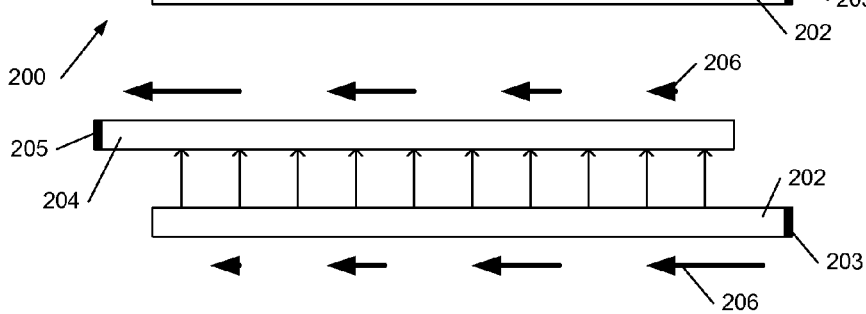

Referring now to FIG. 2a, this shows a simplified schematic view of an OLED lighting tile 200 with a first, anode connection 202 and a second, cathode connection 204, arrows 206 illustrating the direction of current flow within the lighting tile. Referring to FIG. 2b the current flow 208 through the thickness of the OLED structure is also shown, and this is substantially uniform. In the cross-sectional view it can be seen that the sheet current density, as indicated by the length of arrows 206, is greatest in the anode connection near an anode busbar 203 and greatest in the cathode near a cathode busbar 205, decreasing approximately linearly with increasing distance from the respective busbar.

Figure 2C:
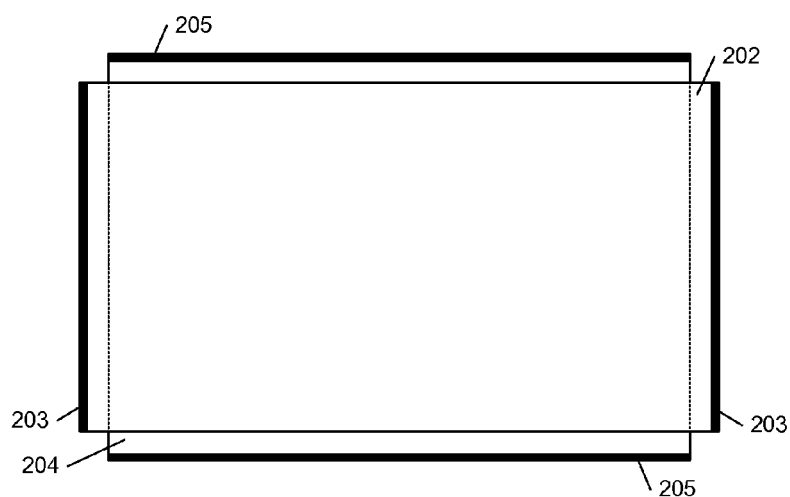

FIG. 2c, in which like elements are indicated by like reference numerals, shows an alternative connection/busbar arrangement in which, again, more current flows of the edges and in which there is a slightly higher voltage at the busbars than in the centre of the tile, albeit the magnitude of the currents are more uniform across the tile.

Figure 1A:
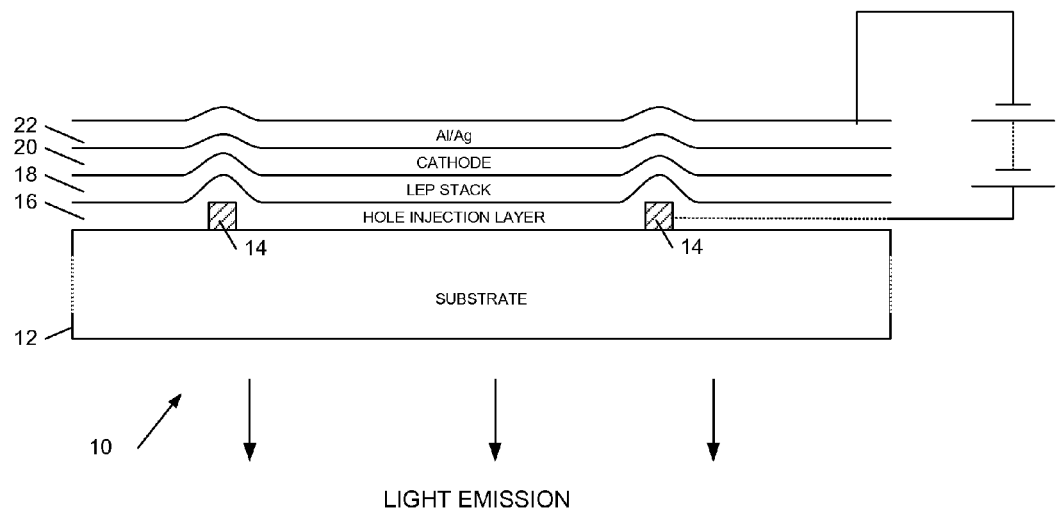
FIGS. 1a and 1b show, respectively, a cross-section through an OLED lighting tile, and a view of a front, light-emitting face of the tile.
Figure 1B:
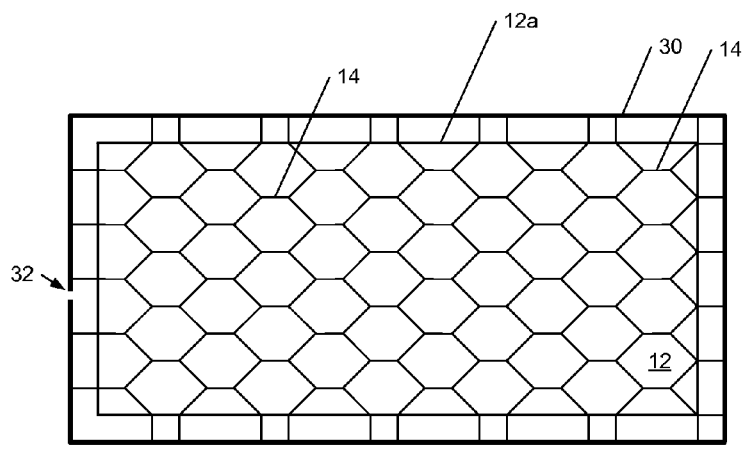
Figure 3A:
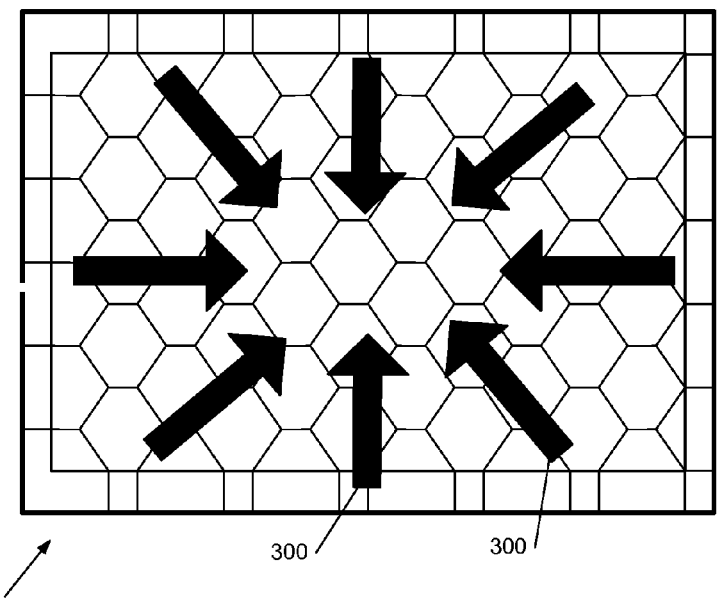
FIGS. 3a and 3b show, respectively, directions of lateral current flow in a lighting tile of the type shown in FIG. 1, and an improved track layout for such a lighting tile according to an embodiment of the invention.
Figure 3B:
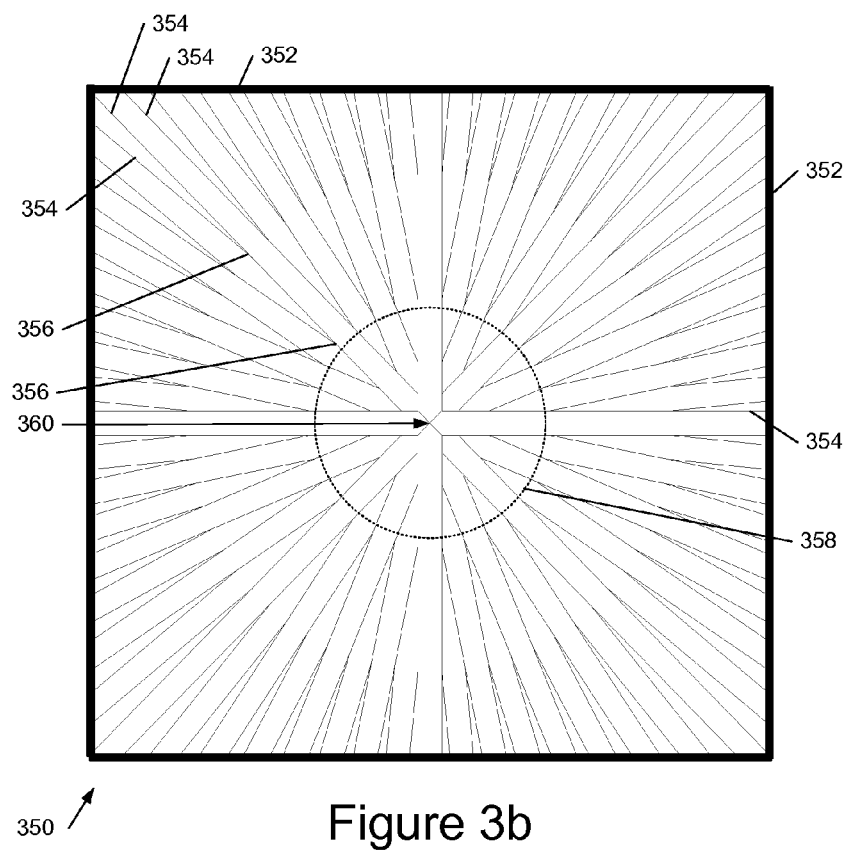

Referring now to FIG. 3a, this shows a tile 10 of the type shown in FIG. 1 on which arrows 300 have been superimposed illustrating the direction of lateral current flow within the device (noting that in the illustrated example the busbars extend around the perimeter of the lighting tile. The pattern of FIG. 3a illustrates that a better design of tracking would be one where tracks are aligned with the direction of current flow. Thus FIG. 3b illustrates, schematically, an OLED lighting tile 350 with a busbar 352 which extends around the perimeter of the tile, and having a plurality of generally radial conductive tracks 354 extending from a central region of the tile towards the busbar at the perimeter. In FIG. 3b a single line illustrates a conductive track; the tracks are not the regions between the lines.

In the arrangement of FIG. 3b the aim is for an approximately uniform sheet resistance in an electrode layer defined by the conductive tracks (although as explained further later in such an arrangement there is still more voltage drop adjacent the perimeter of the device than desirable). As can be seen, each track has a plurality of branch points 356 at which a track branches, in the illustrated example bifurcates. Consider an imaginary circle 358 centred at the centre of the tile: in FIG. 3b the tracks are arranged so that (approximately) as the radius of this circle doubles so does the number of tracks intersected by a circumference of the circle (the number of tracks per unit length around the circumference remains approximately constant). This is not precisely true because the number of tracks is "quantized"—there is a step change in the number of tracks before and after a branching point, but if the circle 358 is considered to define a band then in successively larger bands within the band there is a circle with substantially the same number of tracks crossing it. A skilled person will appreciate that for a rectangular tile with busbars around the edges the circle becomes more like an ellipse.

In principle the number of tracks per unit length of a circumference of such a circle or ellipse need not vary linearly with distance from the centre, but in this case the effect is to distort the pattern of FIG. 3b into a more complicated arrangement in which one track is "special" and the others curve towards it with increasing distance from the centre of the tile. The skilled person will appreciate that although a square tile is illustrated in FIG. 3b for convenience, the described approach is suitable for tiles of other shape including triangular, rectangular and hexagonal tiles.

Optionally cross-tracks (not shown in FIG. 3b) may be provided between the conductive tracks 354. In some preferred embodiments the tracks 354 are connected by tracks 360 at the centre of the tile, mainly as a precaution to link the quadrants of the pattern, but also so that the centre of the tile current does not need to flow too far from a track.

We have described with reference to FIG. 3b an example of a tile in which current is injected from each lateral side of the tile. However other tile configurations are possible, for example, tiles where the currently is flowing broadly from one side towards another, as illustrated in FIG. 2. One might therefore think that the best solution for such tiles would be using horizontal tracks with the occasional cross-track in case of track breaks. However an improved layout can be achieved by taking into account the current density flowing in an electro-layer, and configuring the tracking pattern to use thicker tracks and/or a closer track spacing where the current density is higher.

Figure 4A:
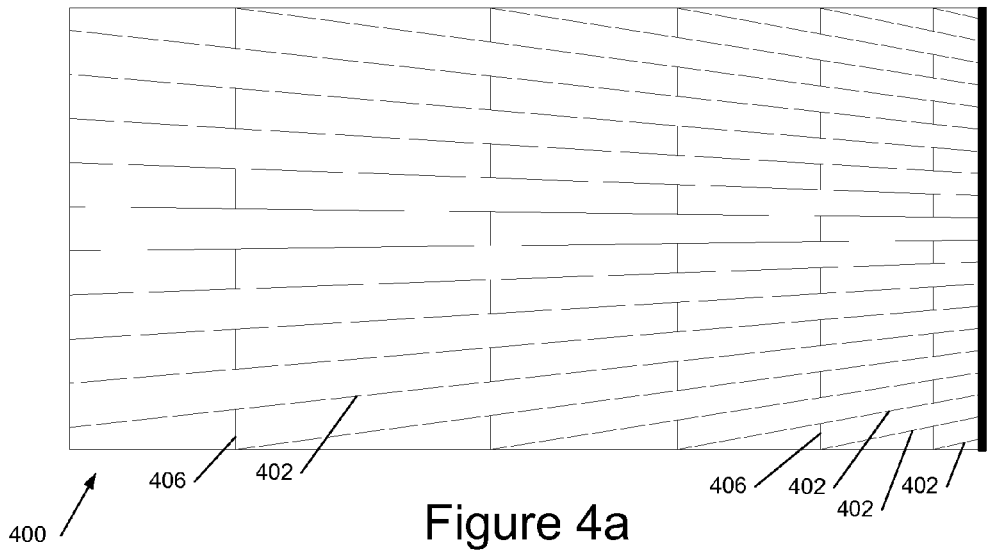
FIGS. 4a and 4b show examples of track layouts for a lighting tile of the type shown in FIG. 2a illustrating respectively, a tile with a substantially linear increase in sheet resistance, and a tile with a substantially linear decrease in sheet conductance, according to embodiments of any aspect of the invention.

Thus referring to FIG. 4a, this shows tracking on an OLED lighting tile 400 with a busbar connection 404 at one lateral side of the tile. Conductive tracks 402 fan out away from busbar 404 to provide a varying track density, and in this example the tracks are straight to provide a substantially linear change in sheet resistance.

Figure 4B:
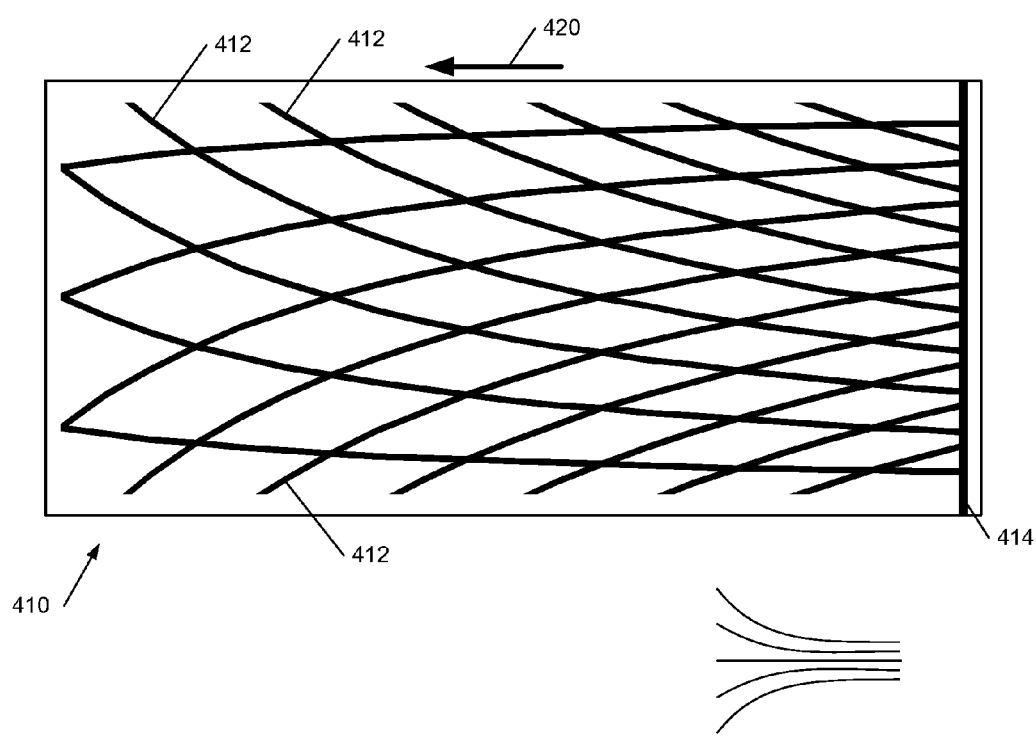

In the example of FIG. 4b a lighting tile 410 is arranged so that the conductive tracks 412 extend away from busbar 414 to provide a substantially linear decrease in sheet conductance, in accordance with the decreasing current flow away from busbar 414. (The arrow for 20 illustrates the direction of current flow; the magnitude of current flow is as schematically shown in FIG. 2b). In FIG. 4b the tracks 412 again fan out, but the tracks are curved. Referring again to FIG. 4a, preferred embodiments include cross-tracks 406 coupling the generally longitudinally extending tracks 402. In the arrangement of FIG. 4b these cross-tracks can conveniently be provided by overlapping two sets of fanning out conductors, defining elongated diamonds between them. In the illustrated example effectively only one half of each set of curved tracks carries the main current. The inset shows an example of one curved fan; over this effectively two halves of a second curved fan are superimposed.

The change in sheet resistance/conductance may be achieved in other ways, for example using branching tracks as previously described with reference to FIG. 3b to reduce the average sheet conductance away from busbar 404/414. Alternatively the tracks may run substantially parallel to the direction of current flow but have a width which varies (decreases) away from busbar 404/414. The skilled person will appreciate that many variations are possible. Similarly the approach as described here can be extended to different shapes of tiles and/or configurations of busbars. For example, for a tile of the type shown in FIG. 2c a pair (or two overlapping pairs) of fans of conductive tracks may be employed each diverging away from a respective busbar 203/205, where the busbars are located at opposite sides (lateral edges) of the tile.

Figure 5:
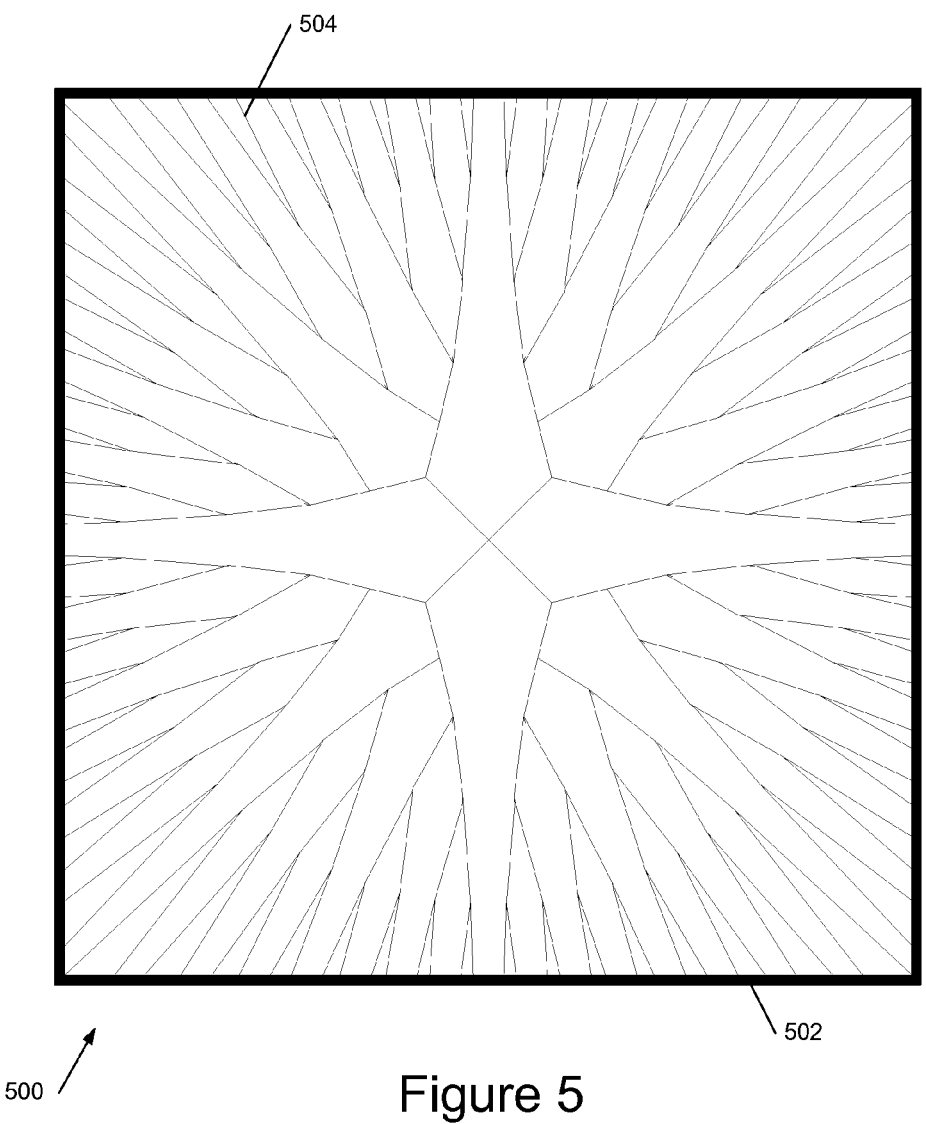
FIG. 5 shows a variant of the track pattern of FIG. 3b in which the sheet conductance is modified in accordance with the magnitude of the current flow, so as to be decreased within a central region of the lighting tile, according to an embodiment of an aspect of the invention.

Thus FIG. 5 shows a schematic illustration of an OLED lighting tile 500 with a busbar 502 on each lateral edge, of the same general type as shown in FIG. 3b, but in which the pattern of conductive tracks has been modified to take account of the magnitude of current flow within a lateral plane of the device, more particularly reducing the sheet conductance in the central region of the tile where the magnitude of the current flow is smallest. Thus the track arrangement of FIG. 5 shows a radial track density proportional to sheet current density in the electrode (track) layer. Again the approach may be extended to other shaped tiles, for example triangular, rectangular or hexagonal tiles. As previously, the tracks are preferably cross-linked in the central region. The skilled person will appreciate that the track arrangement in FIG. 5 is still an approximation to the current flow, particularly adjacent the edges of the lighting tile. This could be appreciated by considering the equipotential lines, which towards the edge of the lighting tile follow the edge of the lighting tile, the current flowing perpendicular to these lines. In general the equipotential lines and sheet current density may be computer modelled to determine a track layout.

Examples of OLED lighting tile tracking designed to optimize conduction in the direction of current flow have been described. The tracking is orientated in the direction of majority current flow, and optionally the tracking density is proportional to current density.

It will be understood that the invention is not limited to the described embodiments and encompasses modifications apparent to those skilled in the art lying within the scope of the following claims.

The invention claimed is:

1. An LED lighting element comprising a substrate bearing an LED structure extending laterally over said substrate and sandwiched between first and second electrode layers, wherein said first electrode layer defines a plurality of electrically conductive tracks and said second electrode layer comprises a substantially continuous electrically conducting layer, said LED lighting element having an electrical busbar connected to said electrically conductive tracks, said busbar extending substantially completely along the or each lateral edge of said lighting element, wherein said tracks run generally radially from a central location within said lighting element towards said busbar, wherein a said track subdivides into a plurality of tracks with increasing distance from said central location, and wherein an average sheet conductance of said first electrode layer in a radial direction from said central location varies according to a current density in said second electrode layer.

2. An LED lighting element as claimed in claim 1 wherein a number density of said tracks per unit of circumferential length around a circle or ellipse within said lighting element centered at said central location is substantially the same for a plurality of different distances of a circumference of said circle or ellipse from said central location.

3. An LED lighting element as claimed in claim 2 wherein said number density of said tracks around said circumference of said circle or ellipse in said first electrode layer varies dependent on current density at a location in said second electrode layer defined by said circumference of said circle or ellipse in said second electrode layer.

4. An LED lighting element as claimed in claim 1 wherein said tracks are curved and wherein a number density of said tracks per unit area is lower adjacent said central location than adjacent a lateral edge of said lighting element.

5. An LED lighting element as claimed in claim 1 where at said central location said tracks are mutually electrically connected.

6. An LED lighting element as claimed in claim 1 wherein said plurality of subdivided tracks each extend generally radially in the direction of current flow in use.

7. An LED lighting element as claimed in claim 1 wherein said lighting element is an OLED lighting tile.

8. An LED lighting element comprising a substrate bearing an LED structure extending laterally over said substrate and sandwiched between first and second electrode layers, wherein said first electrode layer defines a plurality of electrically conductive tracks and said second electrode layer comprises a substantially continuous electrically conducting layer, said LED lighting element having a first electrical busbar connected to said electrically conductive tracks, said first busbar extending along a first lateral edge of said lighting element, said lighting element having a second electrical busbar connected to said second electrode layer and extending along a second lateral edge of said lighting element, wherein a direction of current flow from said first electrical busbar towards said second electrical busbar defines a longitudinal direction, wherein said tracks extend away from said first busbar, wherein an average sheet conductance of said first electrode layer across a width of said lighting element perpendicular to said longitudinal direction varies in said longitudinal direction to decrease with increasing distance from said first busbar, and wherein a number of said tracks across said width decreases with increasing distance from said first busbar.

9. An LED lighting element as claimed in claim 8 wherein said tracks define at least one fan pattern such that among the tracks comprising said fan a spacing between said tracks increases with increasing distance from said first busbar.

10. An LED lighting element as claimed in claim 9 wherein said tracks define a pair of overlapping said fans.

11. An LED lighting element as claimed in claim 8 wherein said tracks comprise one or more sets of curved tracks which curve away from one another with increasing distance from said first busbar.

12. An LED lighting element as claimed in claim 8 wherein said tracks further comprise a plurality of cross-linking tracks cross-linking said tracks which extend from said first busbar.

13. An LED lighting element as claimed in claim 8 wherein said second lateral edge along which said second busbar extends is opposite said first lateral edge and wherein said tracks extend from said first busbar towards said second busbar.

14. An LED lighting element as claimed in claim 8 wherein said lighting element is an OLED lighting tile.

\* \* \* \* \*